United States Patent
Iosad

(10) Patent No.: US 9,627,601 B2
(45) Date of Patent: Apr. 18, 2017

(54) THERMOELECTRIC ELEMENT AND METHOD FOR THE PRODUCTION THEREOF

(71) Applicant: O-FLEXX TECHNOLOGIES GMBH, Duisburg (DE)

(72) Inventor: Nikolay Iosad, Taunusstein (DE)

(73) Assignee: O-FLEXX TECHNOLOGIES GMBH, Duisburg (DE)

(*) Notice: Subject to any disclaimer, the term of this patent is extended or adjusted under 35 U.S.C. 154(b) by 0 days.

(21) Appl. No.: 14/762,863

(22) PCT Filed: Jun. 11, 2013

(86) PCT No.: PCT/EP2013/061989
§ 371 (c)(1),
(2) Date: Jul. 23, 2015

(87) PCT Pub. No.: WO2014/114366
PCT Pub. Date: Jul. 31, 2014

(65) Prior Publication Data
US 2015/0325765 A1    Nov. 12, 2015

(30) Foreign Application Priority Data

Jan. 24, 2013  (DE) .................. 10 2013 100 691

(51) Int. Cl.
*H01L 35/02* (2006.01)
*H01L 35/28* (2006.01)
(Continued)

(52) U.S. Cl.
CPC .............. *H01L 35/32* (2013.01); *H01L 27/16* (2013.01); *H01L 35/02* (2013.01); *H01L 35/08* (2013.01); *H01L 35/28* (2013.01); *H01L 35/34* (2013.01)

(58) Field of Classification Search
CPC .......... H01L 35/02; H01L 35/32; H01L 27/16; H01L 35/28; H01L 35/34
(Continued)

(56) References Cited

U.S. PATENT DOCUMENTS

| 6,762,484 B2 | 7/2004 | Span | |
| 2007/0144573 A1* | 6/2007 | Mihara | ................ C03C 17/23 |
| | | | 136/205 |
| 2008/0173537 A1* | 7/2008 | DeSteese | ................ H01L 35/08 |
| | | | 204/192.25 |

FOREIGN PATENT DOCUMENTS

| DE | WO 8907836 A1 * | 8/1989 | ............ G04C 10/00 |
| EP | 1287566 | 3/2003 | |

(Continued)

OTHER PUBLICATIONS

English machine translation of JP 2011-192923.*
(Continued)

*Primary Examiner* — Lindsey Bernier
(74) *Attorney, Agent, or Firm* — Lucas & Mercanti, LLP

(57) ABSTRACT

A thermoelectric element includes a first thermoelectric layer and a second thermoelectric layer, wherein a p-n junction is formed when the layers are formed. To specify a generic thermoelectric element that is suitable for a series connection in a thermoelectric generator without cabling, according to the invention—a substrate comprises a first and second contact surface on a cold side and a third contact surface on a hot side of the substrate. A temperature gradient can be applied between the contact surfaces on the cold and hot side. The first thermoelectric layer of the thermoelectric element is arranged on the substrate and connects a second contact surface to a third contact surface. The second thermoelectric layer of the thermoelectric element is arranged on the first thermoelectric layer, the p-n junction thereby being formed, and is connected to the first contact (Continued)

surface. The invention further relates to a method for producing such a thermoelectric element.

12 Claims, 3 Drawing Sheets

(51) Int. Cl.
*H01L 35/30* (2006.01)
*H01L 35/32* (2006.01)
*H01L 27/16* (2006.01)
*H01L 35/08* (2006.01)
*H01L 35/34* (2006.01)

(58) Field of Classification Search
USPC ........ 136/203, 205, 211, 212, 225, 227, 230
See application file for complete search history.

(56) References Cited

FOREIGN PATENT DOCUMENTS

| | | |
|---|---|---|
| EP | 1976034 | 10/2008 |
| JP | 2008205129 | 9/2008 |
| JP | 2011192923 A * | 9/2011 |
| WO | 2004013900 | 2/2004 |
| WO | 2010142880 | 12/2010 |

OTHER PUBLICATIONS

English machine translation of WO 89/07836.*
English Translation of International Preliminary Report on Patentability, Jul. 24, 2015.

* cited by examiner

THERMOELECTRIC ELEMENT AND METHOD FOR THE PRODUCTION THEREOF

CROSS-REFERENCE TO RELATED APPLICATIONS

This application is a 371 of PCT/EP2013/061989 filed Jun. 11, 2013, which in turn claims the priority of DE 10 2013 100 691.4 filed Jan. 24, 2013, the priority of both applications is hereby claimed and both applications are incorporated herein by reference.

BACKGROUND OF THE INVENTION

The invention pertains to a thermoelectric thin-layer element with a first and a second thermoelectric layer, wherein the layers are configured to form a p-n junction. The invention also pertains to a method for the production of a thermoelectric element of this type and to a thermoelectric generator.

A thermoelectric element of the class in question is known from EP 1 287 566 B1. In this thermoelectric element, the efficiency which is achieved is higher than in conventional thermoelectric elements because the p-n junction is formed essentially over the entire extent of the n- and p-layers, wherein a temperature gradient is applied along the p-n boundary layer. A temperature difference is thus created along this elongated p-n junction between the two ends of the p-n layer package, which leads to a thermoelectric element with much greater efficiency than that of conventional thermoelectric elements. The thermoelectric element of the class in question is contacted selectively at the n- and p-layers. This can be done either by the alloying of the contacts into place and the p-n junctions thus connected to each other or by contacting the n- and p-layers directly. To combine several thermoelectric elements of the class in question into a module, these elements are connected in series by crisscrossing lines. Thermally, the individual thermoelectric elements of the module are connected in parallel.

SUMMARY OF THE INVENTION

Against the background of this prior art, the invention is based on the goal of proposing a thermoelectric element of the class in question which is suitable for creating a series circuit in a thermoelectric generator without cabling. In addition, a method is also to be provided for producing a thermoelectric element of this type.

The goal is achieved on the basis of the idea that thermoelectric thin-layer elements can be connected on the cold side by means of two contact surfaces and on the hot side by means of one contact surface. In addition, the invention is based on the idea of making available a low-cost method for producing the three contact surfaces.

In detail, the goal pertaining to a thermoelectric element of the type described above is achieved in that
  a substrate comprises a first contact surface and a second contact surface on a cold side of the substrate and a third contact surface on a hot side;
  a temperature gradient can be applied between the contact surfaces on the cold and hot sides;
  the first thermoelectric layer of the thermoelectric element is arranged on the substrate and connects a second contact surface to a third contact surface; and
  the second thermoelectric layer of the thermoelectric element is arranged on the first thermoelectric layer to form a p-n junction and is connected to the first contact surface.

The layer package consisting of a p-layer and an n-layer is contacted selectively by means of the first and second contact surfaces on the cold side, in that a contacting section of the first thermoelectric layer is arranged on the second contact surface of the substrate, whereas a selective contacting of the second thermoelectric layer is achieved by arranging a contacting section of the second thermoelectric layer on the first contact surface of the substrate. The contacting section of the second thermoelectric layer projects beyond the p-n junction between the first and second thermoelectric layers.

To allow the temperature gradient to act in the direction of the boundary layer between the n-layer and the p-layer, a temperature gradient can be applied between the contact surfaces on the cold and hot sides. For this purpose, it is necessary for the contacting sections of the first and second thermoelectric layers to overlap only partial areas of their assigned contact surfaces. Good thermal coupling to the heat source or heat sink is thus ensured across the remaining areas of the contact surfaces. At the same time, the thermoelectric layers are selectively contacted electrically via the first and second contact surfaces on the cold side.

If the first thermoelectric layer consists of an n-conductive thermoelectric semiconductor material, the second thermoelectric layer will then consist of a p-conducting thermoelectric material. If the first thermoelectric layer consists of a p-conductive thermoelectric material, the second thermoelectric layer will then consist of an n-conducting thermoelectric material. The p-n junction is preferably formed along the entire, preferably the longest, dimension of the n-layer and of the p-layer and thus essentially along their entire boundary layer.

Semiconductor materials which can be considered in particular for the thermoelectric materials include $Bi_2Te_3$, PbTe, SiGe, BiSb, and $FeSi_2$.

The substrate consists of an electrically insulating material with a thermal conductivity significantly lower than that of the contact surfaces. The substrate material can be rigid or flexible. Kapton, Kevlar, and circuit board materials such as EP2, 85N, 35N, or composite materials can be considered for use as substrate materials.

The contact surfaces must have high electrical conductivity and high thermal conductivity to achieve good thermal coupling to the heat source and heat sink by means of clamps, adhesives, or some other integral bonding method. The high electrical conductivity is required for the selective contacting of the layer materials and also for the tapping of the voltage generated by the thermoelectric element or generator. Materials which are suitable for the contact surfaces include metals with high electrical and thermal conductivity, especially copper and copper alloys. The contact areas can also be coated with nickel as a diffusion barrier.

To keep the contacting sections of the first and second layers extending from the p-n junction as short as possible in the interest of high efficiency, the third contacting surface is preferably offset from the first and second contact surfaces. The offset is preferably selected so that an extension of the gap between the first and second contact surfaces intersects the third contact surface.

The output voltage of the voltage generated by the thermoelectric elements can be increased in a thermoelectric generator by connecting several thermoelectric elements thermally in parallel and electrically in series. In the interest of automated production of a generator of this type, all of the thermoelectric elements are preferably arranged on only a single substrate, wherein the first and second contact surfaces of all of the thermoelectric elements are arranged in a row on the hot side, and the third contact surfaces of all the thermoelectric elements are arranged in a row on the cold side of the substrate. The substrate preferably comprises an elongated rectangular form, wherein one longitudinal edge forms the hot side and the opposite longitudinal edge the cold side. The rows of contact surfaces on the hot and cold sides extend parallel to the longitudinal edges. The first and second contact surfaces are preferably considerably larger than the contacting sections of the first and second thermoelectric layers resting on the contact surfaces. As a result of this size ratio, it is possible according to the invention for the second contact surface of a thermoelectric element to form simultaneously the first contact surface of an adjacent thermoelectric element of the generator. It thus becomes especially easy and inexpensive to connect the adjacent thermoelectric elements of a thermoelectric generator in series.

A preferred method for the production of a thermoelectric element or of a generator obtained therefrom by providing at least a first contact surface and a second contact surface on a cold side of a substrate and a third contact layer on the list side of the substrate; applying a first thermoelectric layer to the substrate so that it connects the second contact surface to the third contact surface; and applying a second thermoelectric layer to the first thermoelectric layer so that the second thermoelectric layer connects to the first contact surface and forms a p-n junction. The application of the thermoelectric layers can be accomplished by various deposition methods, preferably, however, by means of a printing process. Printing methods which are suitable for the thermoelectric material include in particular inkjet, offset, and gravure printing processes. The ink used can contain particles of bismuth telluride ($Bi_2Te_3$), antimony telluride ($Sb_2Te_3$), and/or bismuth selenide ($Bi_2Se_3$), doped silicon-germanium (SiGe), doped silicon (Si), or other thermoelectric materials.

After the application of a layer of thermoelectric material, this material is preferably sintered and/or cured, in order to change the properties of the applied layers. A curing treatment of this type eliminates crystal defects. One speaks of "sintering" to the extent that, in addition, pressure is exerted during the temperature treatment.

BRIEF DESCRIPTION OF THE DRAWINGS

The method for the production of a thermoelectric element or module according to the invention is explained in greater detail below on the basis of FIGS. 1-3.

DETAILED DESCRIPTION OF THE PREFERRED EMBODIMENTS

Figure 1:
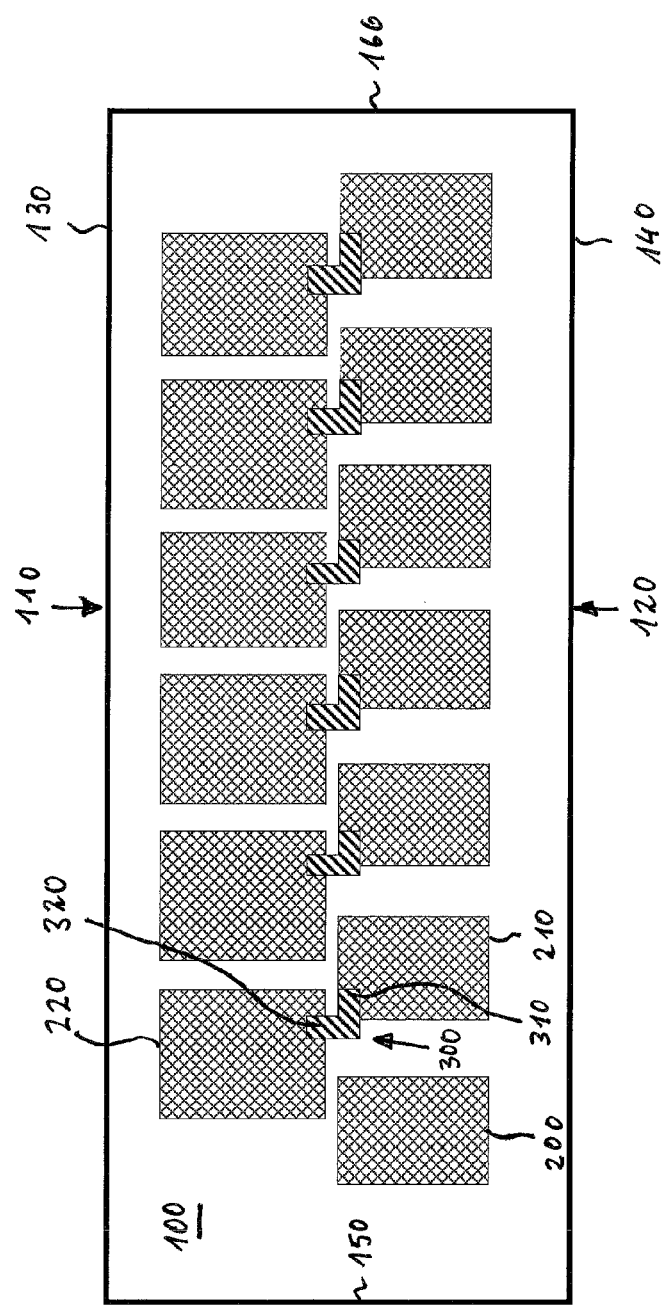
FIG. 1 shows a schematic layout after the application of the first thermoelectric layer.

FIG. 1 shows a substrate 100 with a hot side 110 and a cold side 120. The substrate 100 comprises an elongated rectangular form, which is bordered by the longitudinal edges 130, 140 and by the transverse edges 150, 160. To produce the thermoelectric element, the substrate is provided with at least one first contact surface 200 and one second contact surface 210 on the cold side 120, and with at least one third contact surface 220 on the hot side 110. The contact surfaces 200, 210, 220 consist of copper, for example.

On the substrate 100 provided in this way, the layer of p-doped semiconductor material, referred to in the following as the p-layer 300, is applied first in such a way that the p-layer 300 connects the second contact surface 210 to the third contact surface 220. The contacting section 310 overlapping the second contact surface 210 serves the purpose of selectively contacting the thermoelectric element and of decoupling the heat. The contacting section 320 overlapping the third contact surface 220 serves the purpose of coupling the heat from a heat source, which is connected to the third contact surfaces 220.

In the next step of the method, illustrated in FIG. 2, the second thermoelectric layer of thermoelectrically conductive, n-doped material, referred to in the following in brief as the n-layer 330, is applied on the p-layer 300 to form the p-n junction and is simultaneously connected to the first contact surface 200. The contacting section 340 overlapping the first contact surface 200 serves the purpose of decoupling the heat. The n-layer 330 and the p-layer 300 form a p-n junction in the X direction (compare FIG. 2), wherein the contacting section 310 of the p-layer 300 makes selective electrical contact with the second contact surface 210, and the contacting section 340 of the n-layer 330 makes selective electrical contact with the first contact surface 200.

Figure 2:
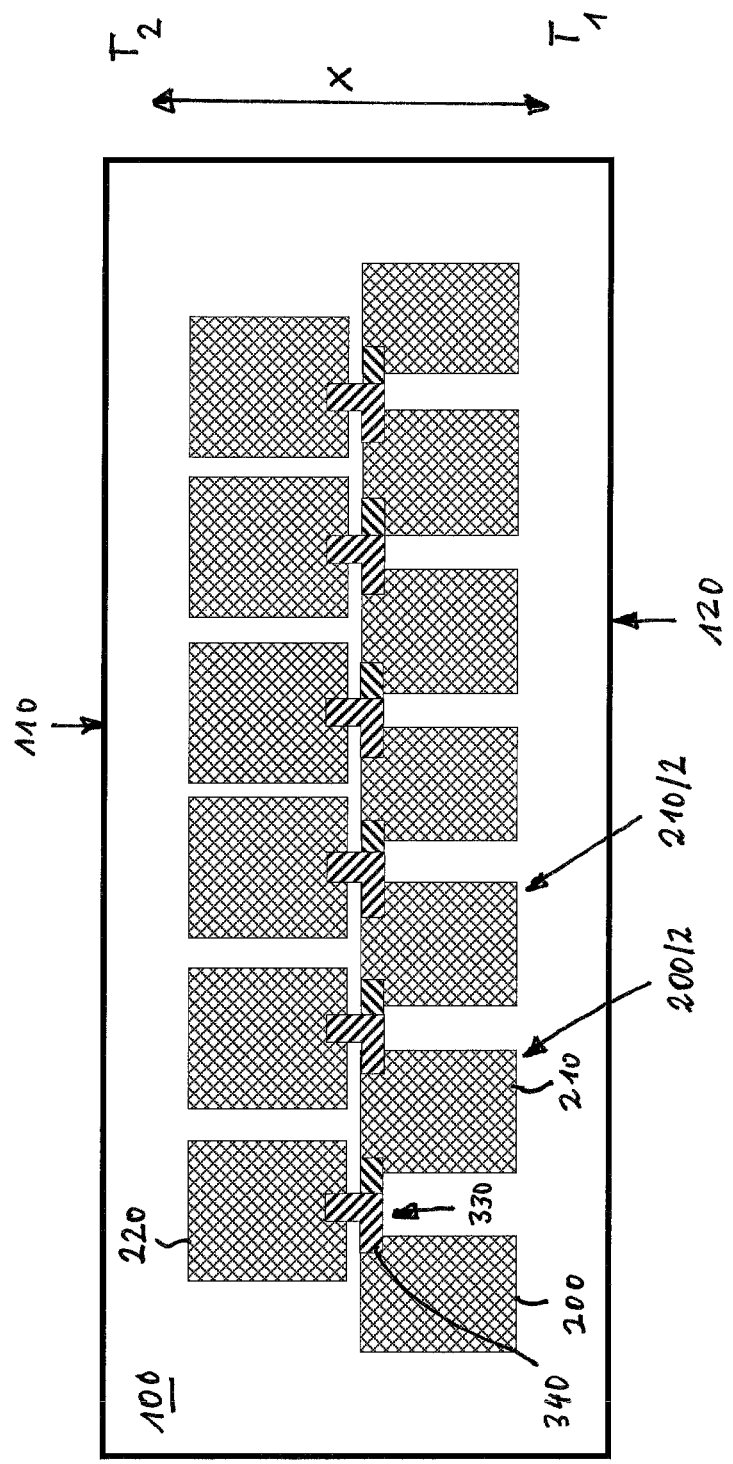
FIG. 2 shows a schematic layout after the application of the second thermoelectric layer.

The temperature gradient in the boundary layer between the n-layer 300 and the p-layer 330 extends parallel to the X direction from the hot side 110 to the cold side 120, as shown in FIG. 2. As a result of the temperature gradient parallel to the boundary layer between the n-layer and the p-layer, electron-hole pairs are generated in the area of high temperature, and these pairs are recombined in the area of the lower temperature, thus leading to compensating currents on the cold side 120. Because the potential modulation between the n-layer and the p-layer becomes different from that present under conditions of thermal equilibrium, a voltage can be tapped between the n-layer and p-layer via the first and second contact surfaces 200, 210.

With respect to the technical aspects of fabrication, it is advantageous for the third contact surface 220 to be offset from the first and second contact surfaces 210, 220, as can be seen in FIGS. 1 and 2. The gap between the first and second contact surfaces 200, 210 is wider than the width of the p-n junction between the p-layer 300 and the n-layer 330, so that the p-n junction can extend from the offset third contact surface 220 into the gap between the first and second contact surfaces 200, 210 without overlapping the contact surfaces 200, 210. The contacting sections 310, 340, which proceed toward the first and second contact surfaces 200, 210, extend at right angles from the p-n junction 300, 330.

To connect several thermoelectric elements together to form a module, these elements are preferably arranged on a single substrate 100, wherein the first and second contact surfaces 200, 210 of all of the thermoelectric elements are arranged in a row on the hot side 110, and the third contact surfaces 220 of all the thermoelectric elements are arranged in a row on the cold side 120. The series connection of several thermoelectric elements of a thermoelectric generator can be accomplished quite easily if the second contact surface 210 of a first thermoelectric element simultaneously forms the first contact surface 200 of the adjacent thermoelectric element, as can be seen in the top view of FIG. 2. Proceeding from the first thermoelectric element shown on the left in the top view, the second thermoelectric element shares the second contact surface 210 with the first thermoelectric element, wherein the second contact surface 210 forms the first contact surface 200/2 for the second thermoelectric element.

Figure 3:
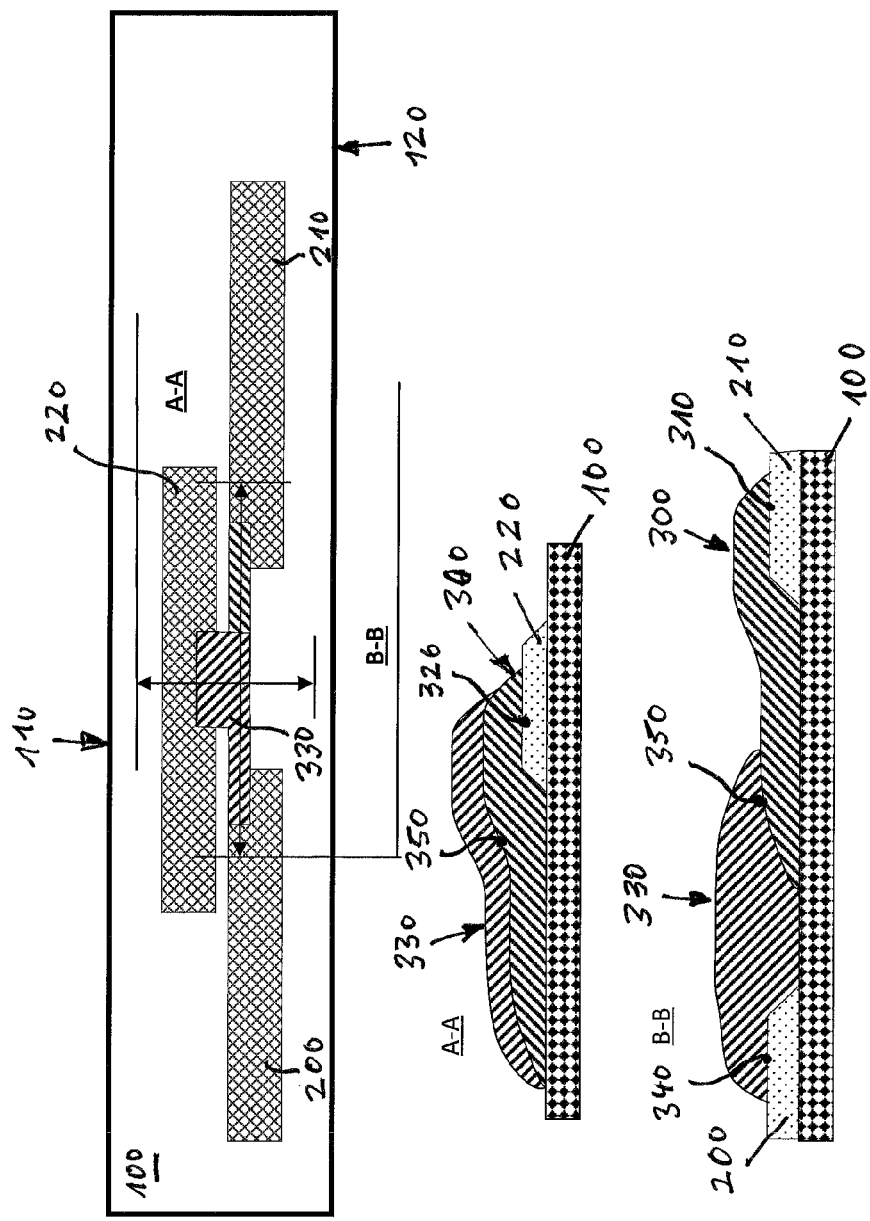
FIG. 3 shows a top view of a completed thermoelectric element as well as the cross sections A-A and B-B.

FIG. 3 shows a detailed layout of the thermoelectric element produced according to the method according to the invention as well as the cross sections A-A and B-B. The three contact surfaces 200, 210, 220 on the substrate 100 can be seen in the top view. The contact surfaces 200, 210 belong to the series of contact surfaces on the cold side 120, whereas the third contact surface 220 belongs to the series of contact surfaces on the hot side 110.

In the cross section A-A, it can be seen how the contacting section 320 of the p-layer 300 overlaps the third contact surface 220 and in the other direction extends toward the cold side 120 on the substrate 100 in the gap between the first and second contact surfaces 200, 210. In addition, the n-layer 330 can be seen, which has been applied to the p-layer 300 to form the p-n junction 350.

It can be seen in the cross section B-B how the contacting section 340, 310 extending from the p-n junction 350 in the longitudinal direction of the substrate 100 overlap the first and second contact surfaces 200, 210. As can be seen in the cross section B-B, the p-layer 300 and the n-layer 330 overlap each other only above the substrate 100, in the gap between the first and second contact surfaces 200, 210.

List of Reference Numbers

| No. | Designation |
|-----|-------------|
| 100 | substrate |
| 110 | hot side |
| 120 | cold side |
| 130 | longitudinal edge |
| 140 | longitudinal edge |
| 150 | transverse edge |
| 160 | transverse edge |
| 200 | first contact surface |
| 210 | second contact surface |
| 220 | third contact surface |
| 300 | p-layer |
| 310 | contacting section |
| 320 | contacting section |
| 330 | n-layer |
| 340 | contacting section |
| 350 | p-n junction |

The invention claimed is:

1. A thermoelectric element, comprising:
a layer package formed by a first thermoelectric layer and a second thermoelectric layer configured to form a p-n junction, wherein the first thermoelectric layer consists of an n-conductive thermoelectric material and the second thermoelectric layer consists of a p-conductive thermoelectric material, or the first thermoelectric layer consists of a p-conductive thermoelectric material and the second thermoelectric layer consists of an n-conductive thermoelectric material; and
a substrate having a hot side and a cold side with contact surfaces, a first contact surface and a second contact surface of the contact surfaces arranged on the cold side and a third contact surface of the contact surfaces arranged on the hot side,
the substrate configured so that a temperature gradient can be applied across a space between the third contact surface of the hot side and the first contact surface and the second contact surface on the cold side,
the first thermoelectric layer being disposed on the substrate and connecting the second contact surface to the third contact surface, the second thermoelectric layer being disposed on the first thermoelectric layer to form the p-n junction and being connected to the first contact surface, wherein the temperature gradient is applied to the p-n junction, and in the area of the p-n junction, the substrate, the first thermoelectric layer, the p-n junction, and the second thermoelectric layer form a laminate with the first thermoelectric layer disposed between the substrate and the p-n junction, and the p-n junction disposed between the first thermoelectric layer and the second thermoelectric layer,
the first contact surface and the second contact surface on the cold side of the substrate respectively makes selective contact with the second thermoelectric layer and the first thermoelectric layer, so that a contact section of the first thermoelectric layer is disposed on the second contact surface and a contact section of the second thermoelectric layer is disposed on the first contact surface, and the contact section of the second thermoelectric layer extends over the p-n junction,
the contact section of the first thermoelectric layer overlaps only a partial area of the second contact surface and the contact section of the second thermoelectric layer overlaps only a partial area of the first contact surface, and
the p-n junction extends in the direction of the temperature gradient from a contact section overlapping the third contact surface into the space between the third contact surface on the hot side and the first contact surface and the second contact surface on the cold side.

2. The thermoelectric element according to claim 1, wherein the substrate consists of an electrically insulating material with a thermal conductivity lower than that of the contact surfaces.

3. The thermoelectric element according to claim 1, wherein the contact surfaces are formed of metals.

4. The thermoelectric element according to claim 1, wherein the third contact surface is arranged with an offset to the first and second contact surfaces.

5. A thermoelectric generator comprising a plurality of thermoelectric elements according to claim 1 connected thermally in parallel and electrically in series.

6. The thermoelectric generator according to claim 5, wherein the thermoelectric elements are arranged on only a single substrate;
the first and second contact surfaces of each of the thermoelectric elements are arranged in a row on the cold side of the substrate; and
the third contact surfaces of all of the thermoelectric elements are arranged in a row on the hot side of the substrate.

7. A thermoelectric generator comprising:
a substrate having a hot side and a cold side with contact surfaces,
a plurality of thermoelectric elements connected thermally in parallel and electrically in series on the substrate,
each thermoelectric element including:
a layer package formed by a first thermoelectric layer and a second thermoelectric layer configured to form a p-n junction, wherein the first thermoelectric layer consists of an n-conductive thermoelectric material and the second thermoelectric layer consists of a p-conductive thermoelectric material, or the first thermoelectric layer consists of a p-conductive thermoelectric material and the second thermoelectric layer consists of an n-conductive thermoelectric material, the first thermoelectric layer being disposed on the substrate and connecting a second contact surface of the contact surfaces on the cold side to a third contact surface of the contact surfaces on the hot side, the second thermoelectric layer being disposed on the first thermoelectric layer to form the p-n junction and being connected to a first contact surface of the contact surfaces on the cold side, wherein a temperature gradient is applied to the p-n junction, and in the area of the p-n junction, the substrate, the first thermoelectric layer, the p-n junction, and the second thermoelectric layer form a laminate with the first thermoelectric layer disposed between the substrate and the p-n junction, and the p-n junction disposed between the first thermoelectric layer and the second thermoelectric layer, the first contact surface and the second contact surface on the cold side of the substrate respectively makes selective contact with the second thermoelectric layer and the first thermoelectric layer, so that a contact section of the first thermoelectric layer is disposed on the second contact surface and a contact section of the second thermoelectric layer is disposed on the first contact surface, and the contact section of the second thermoelectric layer extends over the p-n junction, the contact section of the first thermoelectric layer overlaps only a partial area of the second contact surface and the contact section of the second thermoelectric layer overlaps only a partial area of the first contact surface, and the p-n junction extends in the direction of the temperature gradient from a contact section overlapping the third contact surface into a space between the third contact surface on the hot side and the first contact surface and the second contact surface on the cold side, wherein the second contact surface of one of the thermoelectric elements simultaneously forms the first contact surface of an adjacent one of the thermoelectric elements.

8. A method for the production of a thermoelectric element with a layer package formed by a first thermoelectric layer and a second thermoelectric layer configured to form a p-n junction, wherein the first thermoelectric layer consists of an n-conductive thermoelectric material and the second thermoelectric layer consists of a p-conductive thermoelectric material, or the first thermoelectric layer consists of a p-conductive thermoelectric material and the second thermoelectric layer consists of an n-conductive thermoelectric material, the method comprising:

providing a substrate with a cold side and a hot side, at least a first contact surface and a second contact surface on the cold side, and at least a third contact surface on the hot side of the substrate;

applying the first thermoelectric layer to the substrate such that the first thermoelectric layer connects the second contact surface to the third contact surface; and applying the second thermoelectric layer to the first thermoelectric layer to form the p-n junction, so that the second thermoelectric layer is connected to the first contact surface, a temperature gradient between the hot side and the cold side of the substrate is applied to the p-n junction, and in the area of the p-n junction, the substrate, the first thermoelectric layer, the p-n junction, and the second thermoelectric layer form a laminate with the first thermoelectric layer disposed between the substrate and the p-n junction, and the p-n junction disposed between the first thermoelectric layer and the second thermoelectric layer, wherein the first contact surface and the second contact surface on the cold side of the substrate respectively makes selective contact with the second thermoelectric layer and the first thermoelectric layer, so that a contact section of the first thermoelectric layer is disposed on the second contact surface and a contact section of the second thermoelectric layer is disposed on the first contact surface, and the contact section of the second thermoelectric layer extends over the p-n junction, wherein the contact section of the first thermoelectric layer overlaps only a partial area of the second contact surface and the contact section of the second thermoelectric layer overlaps only a partial area of the first contact surface, and wherein the substrate is configured to apply the temperature gradient across a space between the third contact surface of the hot side and the first contact surface and the second contact surface on the cold side, the first thermoelectric layer and the second thermoelectric layer are applied so that the p-n junction extends in the direction of the temperature gradient from a contact section overlapping the third contact surface into the space.

9. The method for the production of a thermoelectric element according to claim 8, wherein the steps of applying the first thermoelectric layer and the second thermoelectric layer are performed using a printing process.

10. The method for the production of a thermoelectric element according to claim 8, further comprising the step of at least one of sintering and curing the first thermoelectric layer and the second thermoelectric layer.

11. The thermoelectric element according to claim 1, wherein the first thermoelectric layer and the second thermoelectric layer make selective electrical contact with the second contact surface and the first contact surface, respectively, and the contact section overlapping the third contact surface serves to couple heat from the hot side.

12. The method for the production of a thermoelectric element according to claim 8, wherein the first thermoelectric layer and the second thermoelectric layer make selective electrical contact with the second contact surface and the first contact surface, respectively, and the contact section overlapping the third contact surface serves to couple heat from the hot side.

* * * * *